(12) United States Patent
Kim

(10) Patent No.: US 8,531,909 B2
(45) Date of Patent: Sep. 10, 2013

(54) DELAY-LOCKED LOOP HAVING LOOP BANDWIDTH DEPENDENCY ON OPERATING FREQUENCY

(75) Inventor: Youn-Cheul Kim, Ichon-si (KR)

(73) Assignee: SK hynix Inc., Ichon-si (KR)

( * ) Notice: Subject to any disclaimer, the term of this patent is extended or adjusted under 35 U.S.C. 154(b) by 299 days.

(21) Appl. No.: 12/818,929

(22) Filed: Jun. 18, 2010

(65) Prior Publication Data
US 2011/0310682 A1    Dec. 22, 2011

(51) Int. Cl.
*G11C 7/22* (2006.01)
*G11C 8/18* (2006.01)

(52) U.S. Cl.
USPC ............ 365/233.12; 365/233.1; 365/233.13; 365/194

(58) Field of Classification Search
USPC ............ 365/193, 194, 233.1, 233.11, 233.12, 365/233.13
See application file for complete search history.

(56) References Cited

U.S. PATENT DOCUMENTS

| | | | | |
|---|---|---|---|---|
| 5,058,204 A | * | 10/1991 | Tahernia et al. ............ | 455/183.1 |
| 5,128,625 A | * | 7/1992 | Yatsuzuka et al. ............ | 327/156 |
| 7,176,763 B2 | * | 2/2007 | Park ............................. | 331/17 |
| 2001/0052822 A1 | * | 12/2001 | Kim et al. .................... | 331/8 |
| 2003/0012321 A1 | * | 1/2003 | Tokutome et al. ............ | 375/376 |
| 2006/0114069 A1 | * | 6/2006 | Kojima et al. ................ | 331/16 |
| 2010/0110848 A1 | * | 5/2010 | Honma ......................... | 369/47.48 |

FOREIGN PATENT DOCUMENTS

| KR | 2003-0037675 A | 5/2003 |
|---|---|---|
| KR | 10-2006-0046024 A | 5/2006 |

* cited by examiner

*Primary Examiner* — J. H. Hur
(74) *Attorney, Agent, or Firm* — Kilpatrick Townsend & Stockton LLP (57) ABSTRACT

Circuits, methods, and apparatus that vary one or more attributes or parameters of a closed-loop clock circuit as a function of a characteristic of its operating frequency. One example provides a delay-locked loop having a loop bandwidth that can be varied as a function of its operating frequency. In this specific example, operating frequency is determined. This determination may be made directly, either by measuring operating frequency, or indirectly, by taking a measurement or reading, such as by reading a value for column address select latency. Once the operating frequency is determined, the loop bandwidth can be set. In one example, the loop bandwidth is set by adjusting the depth of the delay-locked loop's loop filter.

21 Claims, 9 Drawing Sheets

DELAY-LOCKED LOOP HAVING LOOP BANDWIDTH DEPENDENCY ON OPERATING FREQUENCY

BACKGROUND

Closed-loop clock circuits, such as phase-locked and delay-locked loops, are useful in many applications, including clock and data recovery, data retiming, clock regeneration, and other functions. Delay-locked loops are particularly useful in high-speed systems, such as high-speed memory systems.

Delay-locked loops can be used to generate clock signals, or they can be used to receive clocks signals. For example, a delay-locked loop in a first circuit may generate and provide a clock signal to a delay-locked loop in a second circuit. These delay-locked loops can clean up clock signals by removing jitter and spurious noise components. They can also retime signals to improve the performance of data transfer systems.

Various parameters or attributes can be used to describe the operating characteristics of these closed-loop clock circuits such as delay-locked loops. Loop bandwidth is one such key parameter for delay-locked loops. As loop bandwidth is increased, the resulting jitter is increased, but acquisition time, the time it takes for a delay-locked loop to lock onto an incoming clock signal, is reduced. Conversely, as loop bandwidth is decreased, the resulting jitter is decreased, but the acquisition time is increased.

It is also desirable that a delay-locked loop be able to operate over a large range of frequencies. For example, the operating frequencies of a memory or other device that includes a delay-locked loop may vary over a large range. Accordingly, it is desirable that a delay-locked loop in the memory device also be able to operate over a large range of frequencies.

If loop parameters or attributes, such as bandwidth, are kept constant as operating frequencies change, resulting parameters or attributes, such as jitter and acquisition times, will vary accordingly. It is therefore desirable to vary loop bandwidth of a delay-locked loop as its operating frequency changes.

Thus, what is needed are circuits, methods, and apparatus that allow the bandwidth of closed-loop clock circuits, such as phase-locked and delay-locked loops, to vary with changes in operating frequency.

SUMMARY

Accordingly, embodiments of the present invention provide circuits, methods, and apparatus that vary one or more attributes or parameters of a closed-loop clock circuit as a function of one or more characteristics of its operating frequency. A specific embodiment of the present invention provides a delay-locked loop having a loop bandwidth that can be varied as a function of its operating frequency.

In this specific embodiment of the present invention, operating frequency is determined by reading a register value for a column address select latency. The higher the value for the column address select latency, the higher the operating frequency. Conversely, lower column address select latency values imply lower operating frequencies. In other embodiments of the present invention, the operating frequency is measured directly, for example, by using a frequency to voltage converter, or by using other techniques. In still other embodiments of the present invention, operating frequency can be determined in other ways, for example, by reading a value from a BIOS or operating system.

Once the operating frequency is determined, the loop bandwidth of the delay-locked loop can be set. In a specific embodiment of the present invention, loop bandwidth is controlled by a loop filter. This loop filter may be a moving-average filter, low pass filter, or other type of filter. The depth of the filter may be varied as a function of the determined operating frequency. In this way, the loop bandwidth, and the resulting jitter and acquisition times, are set to desirable values as operating frequency is changed. In other embodiments of the present invention, the type of filter may be varied as a function of the determined operating frequency.

In various embodiments of the present invention, the retimed signal provided by the closed-loop clock circuit may need to be buffered, provided to a pad, or delayed in other ways. In such circumstances, it may be desirable to eliminate the delay of these circuits from the retimed signal. Accordingly, embodiments of the present invention may employ an emulator circuit. This emulator circuit provides a delay that approximately matches the delay caused by buffers, pads or other components. The emulator circuit may be inserted in a feedback path in the closed-loop clock circuit.

Various embodiments of the present invention may incorporate one or more of these and the other features described herein. A better understanding of the nature and advantages of the present invention may be gained by reference to the following detailed description and the accompanying drawings.

DESCRIPTION OF ILLUSTRATIVE EMBODIMENTS

Figure 1:
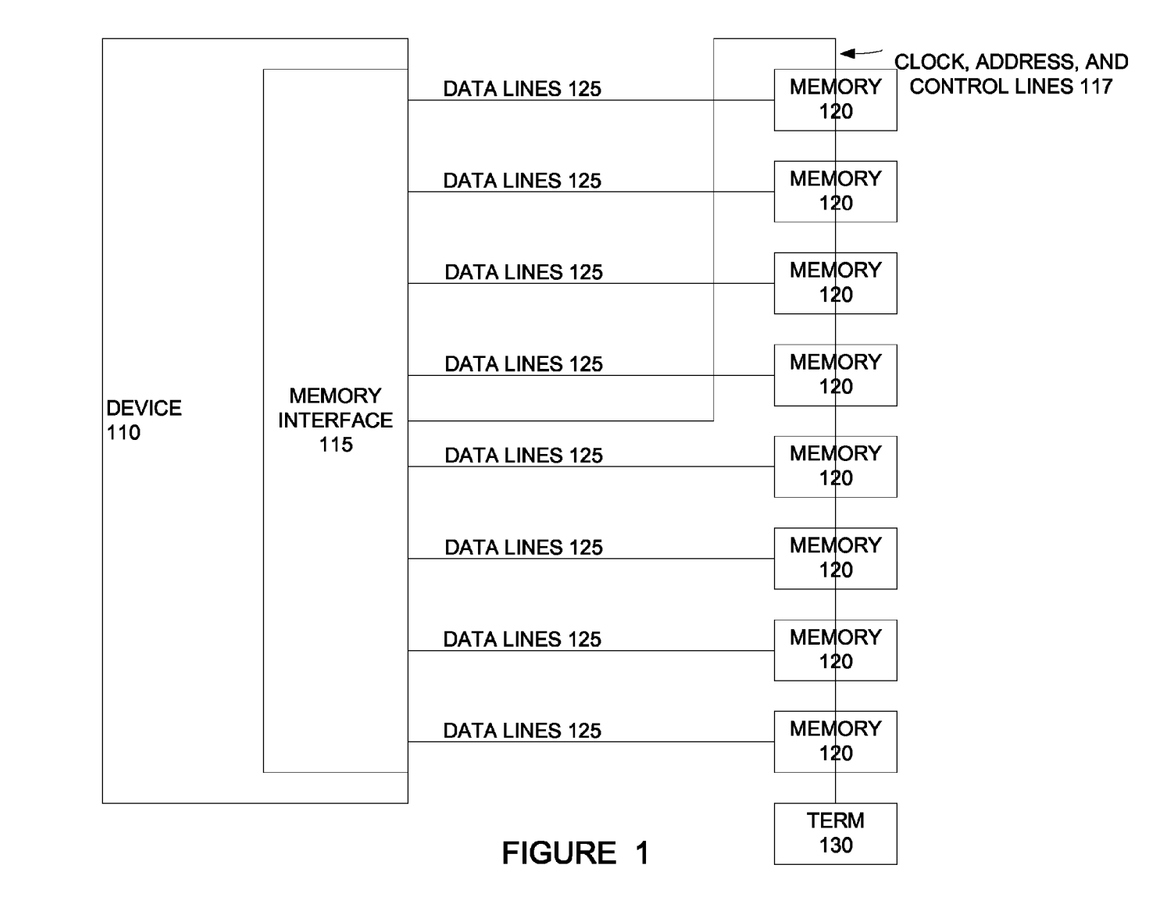
FIG. 1 illustrates a memory subsystem that is improved by the incorporation of an embodiment of the present invention.

FIG. 1 illustrates a memory subsystem that is improved by the incorporation of an embodiment of the present invention. This memory subsystem may be compatible with DDR3 or other memory standards. This figure, as with the other included figures, is shown for illustrative purposes and does not limit either the possible embodiments of the present invention or the claims.

In this memory subsystem, device 110 stores data in, and retrieves data from, a number of memories 120. Device 110 includes memory interface 115 that couples through data lines 125 to memories 120. Memory interface 115 provides clock, address, and control signals to the memories 120 on lines 117. Lines 117 are terminated by termination 130. The clock signals provided on lines 117 may be single-ended or differential signals. In various embodiments of the present invention, they may be unidirectional or bidirectional signals.

In this example, clock signals are provided by memory interface 115 to the memories 120. The clock lines follow a flyby route; that is, they are routed sequentially from one memory 120 to the next. The clock lines are terminated by termination 130. Termination 130 may include resistors or other terminating components.

Again, this circuitry is a memory subsystem where communications take place between device 110 and memories 120. Device 110 may be a processor, graphics processor, or other type of circuit. Memories 120 may be dynamic random access memories, or other types of memory devices. Interface 115 and memories 120 may be compatible with standards such as DDR3, or other standard or proprietary memory specifications.

Other types of electronic systems and circuits may be improved by the incorporation of embodiments of the present invention. Again, this memory subsystem employs a flyby routing technique for the clock lines. In other embodiments of the present invention, other circuit topologies, such as star routing, may be used.

Again, in this flyby topology, the clock is received by each memory 120 sequentially. Memories 120 that are closer to termination 130 receive the clock signal last, while memories further away from termination 130 receive the clock signal earlier. For this reason, jitter performance may be worse at the memories 120 closest to termination 130. In order to improve performance, memory interface 115 and memories 120 may incorporate embodiments of the present invention. An example is shown in the following figure.

Figure 2:
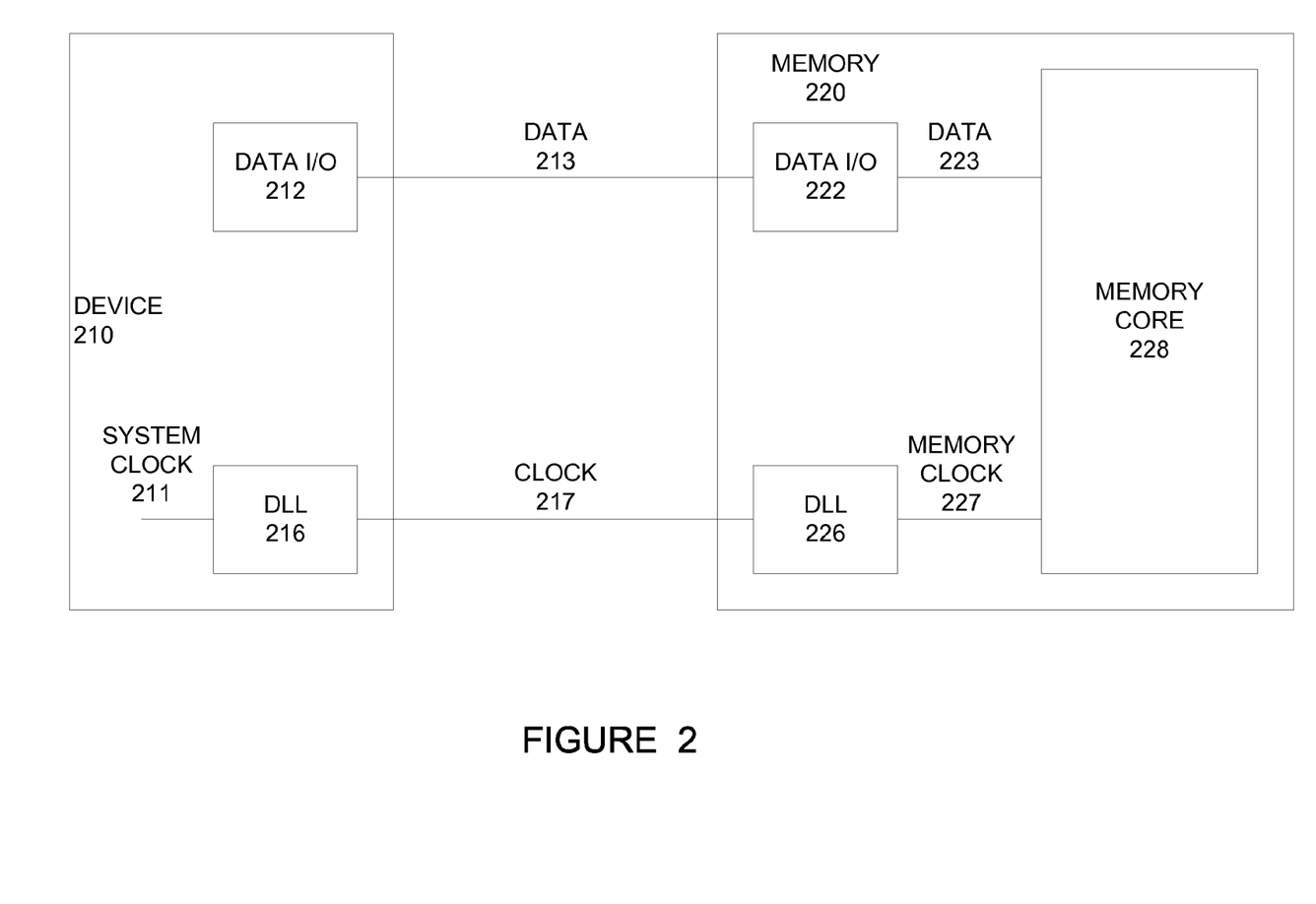
FIG. 2 illustrates a portion of a memory subsystem that is improved by the incorporation of an embodiment of the present invention.

FIG. 2 illustrates a portion of a memory subsystem that is improved by the incorporation of an embodiment of the present invention. This figure includes device 210 that is in communication with memory 220. Data is sent and received by device 210 using data I/O circuitry 212. Data is received and provided by memory 220 using data I/O circuitry 222. Data I/O circuitry 222 provides and receives data from the memory core 228 on lines 223.

In device 210, a system clock on line 211 is retimed by delay-locked loop 216 and provided on clock line 217. The clock signal on line 217 is received by delay-locked loop 226 in memory 220 and provided to the memory core 228 on the memory clock lines 227. In this way, device 210 can retime the system clock signal provided on line 211 using delay-locked loop 216. Similarly, memory 220 can retime the clock signal received on line 217 using delay-locked loop 226. This in turn provides improved accuracy and data transfers between device 210 and memory 220.

In other systems that are improved by embodiments of the present invention, either or both of the delay-locked loops 216 and 226 can be replaced by phase-locked loops, clock generators or drivers, or other closed or open loop clock circuits. In one such system, delay-locked loop 216 is replaced by a phase-locked loop. In this system, a system clock received on line 211 is retimed by a phase-locked loop and received on line 217 by delay-locked loop 226. In another such system, a system clock received on line 211 is driven by a clock driver and received on line 217 by delay-locked loop 226.

In still other embodiments of the present invention, a separate delay-locked loop, phase-locked loop, or clock driver or generator may provide a clock signal on line 217. This clock signal may be retimed or driven by delay-locked loops, phase-locked loops, or clock drivers in device 210 and memory 220.

Figure 3:
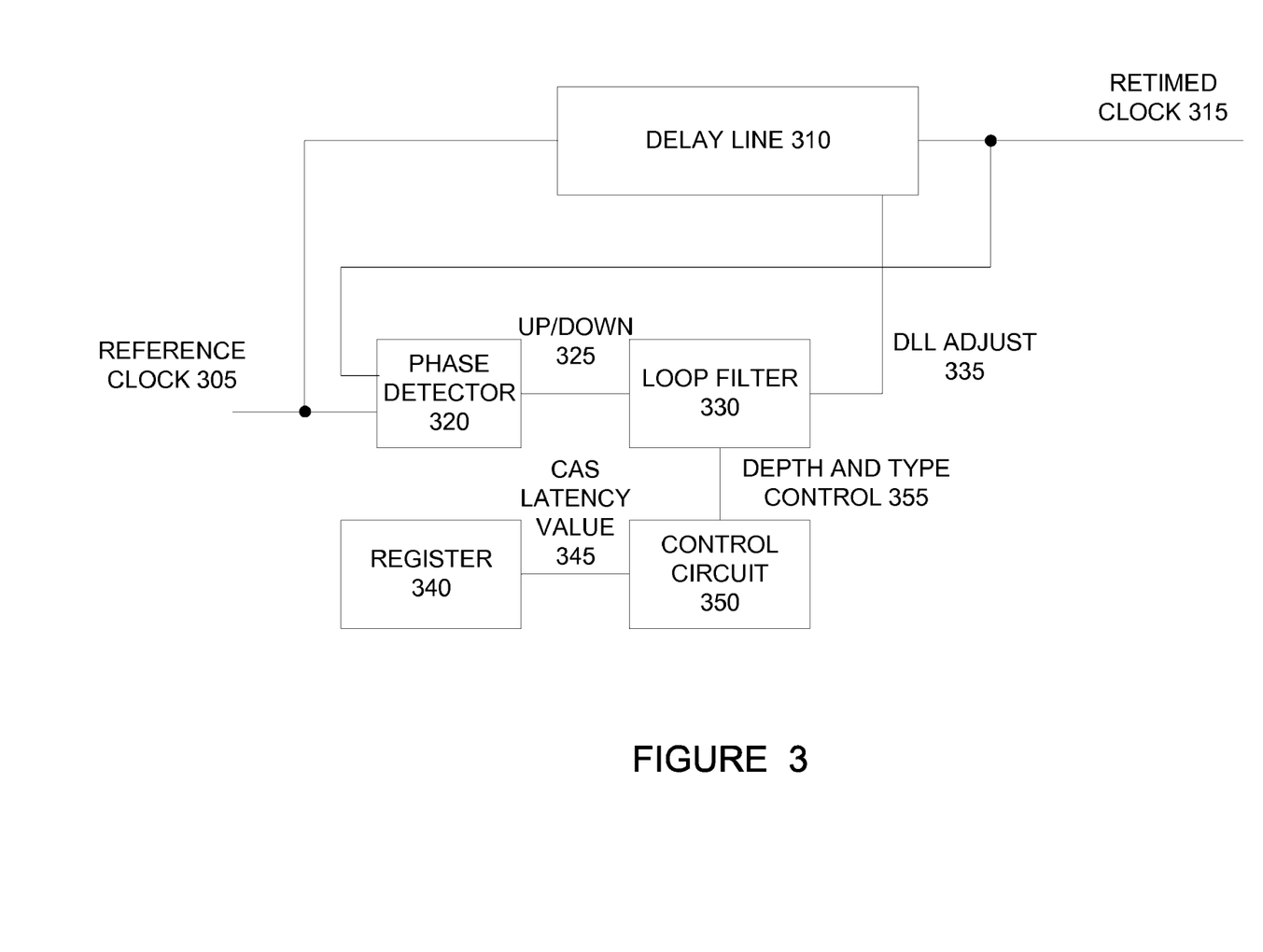
FIG. 3 illustrates a delay-locked loop according to an embodiment of the present invention.

Again, embodiments of the present invention may be used to improved closed-loop clock circuits, such as phase-locked loops or delay-locked loops. An example of a delay-locked loop according to an embodiment of the present invention is shown in the following figure.

FIG. 3 illustrates a delay-locked loop according to an embodiment of the present invention. This figure includes a delay line 310, phase detector 320, loop filter 330, register 340, and control circuit 350. A reference clock is received on line 305 by phase detector 320. The reference clock on line 305 may be a system clock generated by a crystal or other periodic source. The reference clock may also be a received clock signal from another circuit, for example, a circuit on a separate integrated circuit. In various embodiments of the present invention, the reference clock frequency, or operating frequency, may have different values. For example, the frequency of the reference clock may be 500 MHz, 1 GHz, 2 GHz, or other frequency.

In a specific embodiment of the present invention, phase detector 320 may be a D-type flip-flop. In other embodiments of the present invention, phase detector 320 may be other appropriate circuitry. The reference clock on line 305 is further received by delay line 310. Delay line 310 may be a series of current starved inverters, or other appropriate delay circuits. The delay through these delay circuits may be adjusted by DLL adjust signal on line 335.

Delay line 310 provides a retimed clock signal on line 315. In various embodiments of the present invention, this retimed clock signal on line 315 may be provided to circuitry such as memory core 228, memory device 220, or other circuit. The phase of the retimed clock signal on line 315 is compared to the phase of the reference clock on line 305 by phase detector 320. In this example, if the phase of the reference clock 305 is ahead of the phase of the retimed clock signal on line 315, phase detector 320 provides an up level on up/down signal 325.

The up/down signal on line 325 is received by loop filter 330. This loop filter may be a moving-average filter, low-pass filter, or other appropriate filter. For example, loop filter 330 may employ voting or averaging techniques. When loop filter 330 is a moving-average filter, it averages a number of samples and provides it as an output. The number of samples averaged is referred to as the filter's depth. As a new sample is received by the moving-average filter, it is used as part of a new average, while the oldest sample is dropped and not used. In a specific embodiment of the present invention, the depth may be 1, 2, 4, or 5. In other embodiments of the present invention, it may have other depths, such as 3, 6, 7, or more than 7.

When the depth of loop filter 330 is increased, more samples are averaged to generate the output DLL adjust on line 335. Since more samples are averaged, each sample has less immediate effect on the output. This in turn can be seen as a reduction in loop bandwidth. As mentioned above, a reduced bandwidth decreases jitter, but at the cost of increased signal acquisition time.

Again, as the operating frequency, which is the frequency of the reference clock signal on line 305, varies, the resulting jitter and acquisition time, as measured relative to a clock period, also changes. By changing the filter depth, and thus the loop bandwidth, the resulting jitter and acquisition time can be corrected.

Loop filter 330 provides a delay-locked loop adjust signal on line 335. In this example, if the up/down signal on line 325 indicates up, DLL adjust signal on line 335 acts to shorten the delay through delay line 310. This in turn advances edges of the retimed clock signal on line 315, thereby bringing the retimed clock signal on line 315 in phase with the reference clock on line 305.

Again, it is desirable to change various attributes or parameters of this loop depending on a characteristic of its operating frequency. For example, in a specific embodiment of the present invention, a bandwidth of loop filter 330 is varied with changes in frequency of the reference clock on line 305.

Again, in various embodiments of the present invention, the operating frequency may be determined in various ways. For example, a column address select latency value may be read from a register. Alternately, operating frequency may be directly measure, for example, by using a frequency to voltage converter.

In this specific embodiment of the present invention, register 340 stores a column address select latency value 345. Control circuit 350 reads column address select latency value 345 from register 340. Control circuit 350 in turn generates a depth and type control signal on line 355. Again, the depth of loop filter 330 is the number of up/down signal 325 bits that are averaged by a moving-average filter. The depth of loop filter 330 may be varied depending on the column address select latency value 345 read from register 340. Alternately, the type of filter may be changed based on a column address select latency value 345 read from register 340. Alternately, both the depth and type of filter may be changed based on a column address select latency value 345 read from register 340. These acts are shown in further detail in the following figures.

Figure 4A:
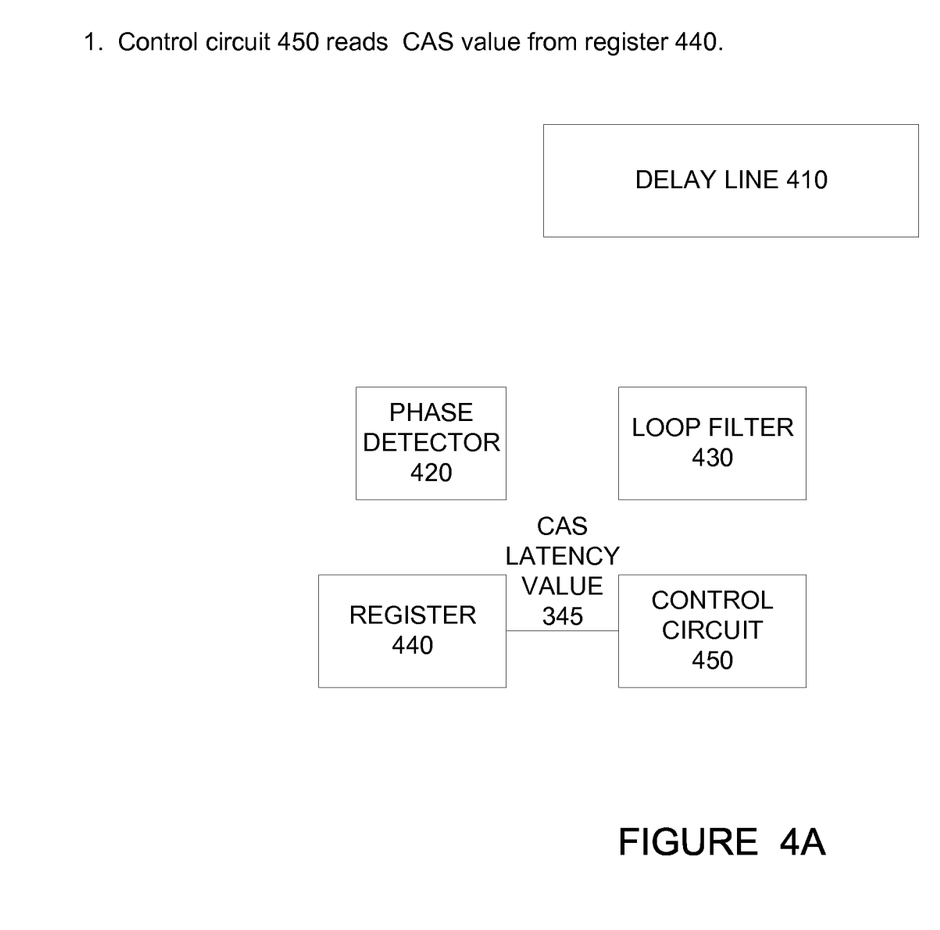
FIGS. 4A-4C illustrate the transfer of data in a delay-locked loop according to an embodiment of the present invention.
Figure 4B:
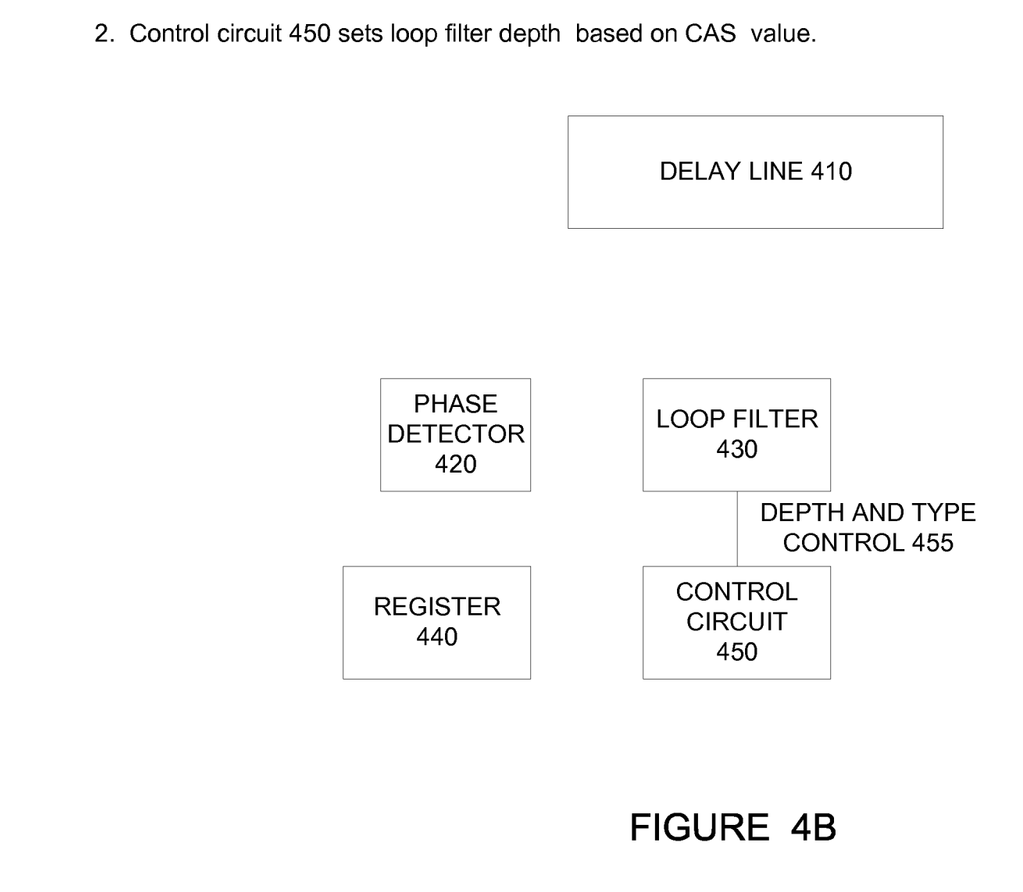
Figure 4C:
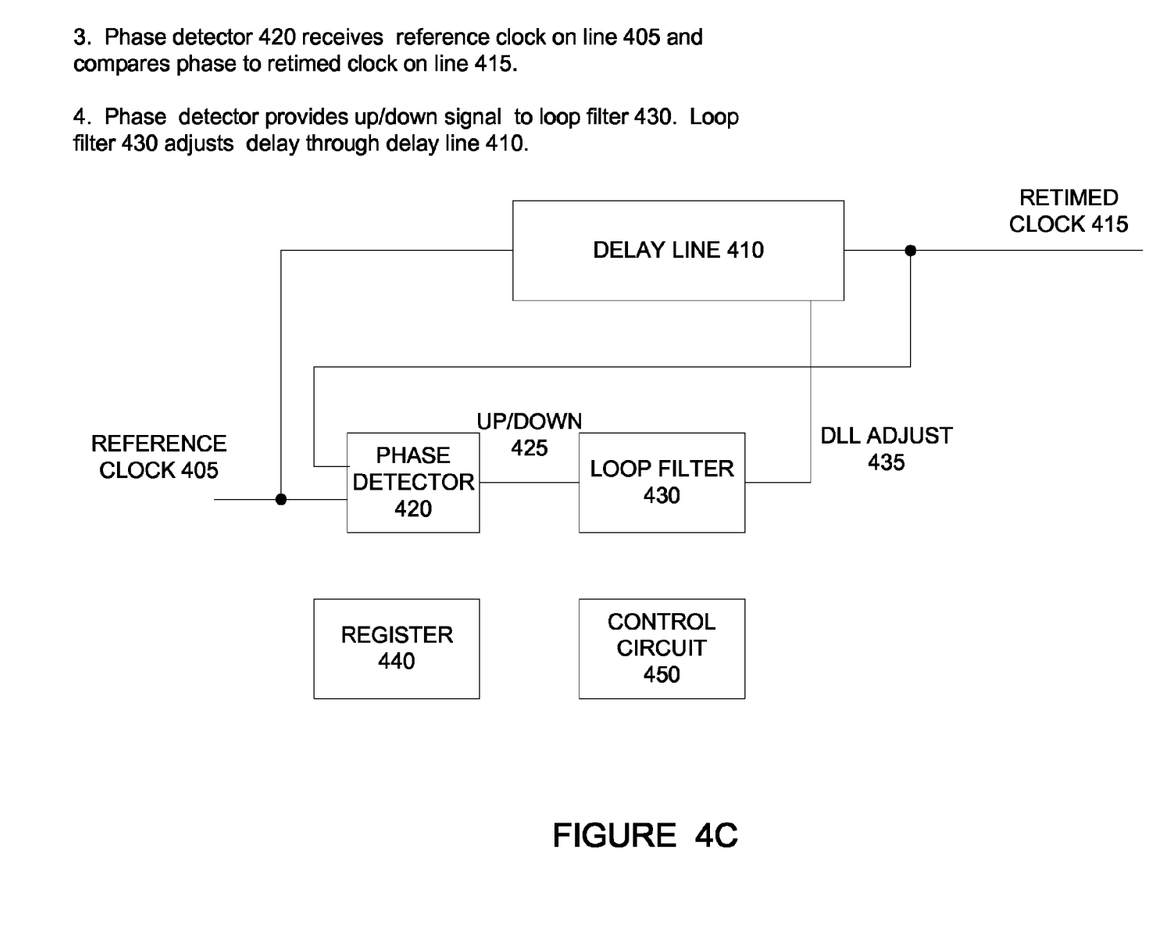

FIGS. 4A-4C illustrate the transfer of data in a delay-locked loop according to an embodiment of the present invention. In FIG. 4A, control circuit 450 reads a column address select latency value 445 from register 440. This register 440 may be on the same integrated circuit as the remaining portions of the delay-locked loop, or it may be on a separate integrated circuit. For example, register 440 may be located in a register on a memory device, while the remainder of the delay-locked loop is located either on the same memory device or on a separate device in communication with the memory device.

In FIG. 4B, control circuit 450 generates depth and type control signals on lines 455, and provides them to the loop filter 430. The loop filter 430 may be a moving-average filter, low-pass filter, or other type of filter. Again, the depth control signal may change the number of samples averaged by the loop filter 430. Alternately, the type of loop filter may be changed from a moving-average filter to a low-pass filter, or it may change from a low-pass filter to a moving-average filter. Alternately, the loop filter may be changed between or among other types of loop filters.

In various embodiments of the present invention, the depth may be set in dependence on the value for the column address select latency in a number of ways. For example, currently common values for column address select latency range from approximately 5-15. In a specific embodiment, if the column address select latency is above a threshold value, the depth of the loop filter 430 may be increased. The threshold value may vary from 8, 9, 10, 11, or less than 8 or more than 11. In other embodiments of the present invention, more than one threshold value may be used.

In FIG. 4C, phase detector 420 receives reference clock on line 405 and compares its phase to the phase of the retimed clock signal on line 415. Phase detector 420 provides an up/down signal to loop filter 430. Loop filter 430 provides a delay-locked loop adjust signal on line 435. The delay-locked loop adjust signal on line 435 adjusts the delay through the delay line 410, such that the phase of the retimed clock signal on line 415 matches the phase of the reference clock on line 405.

Figure 5:
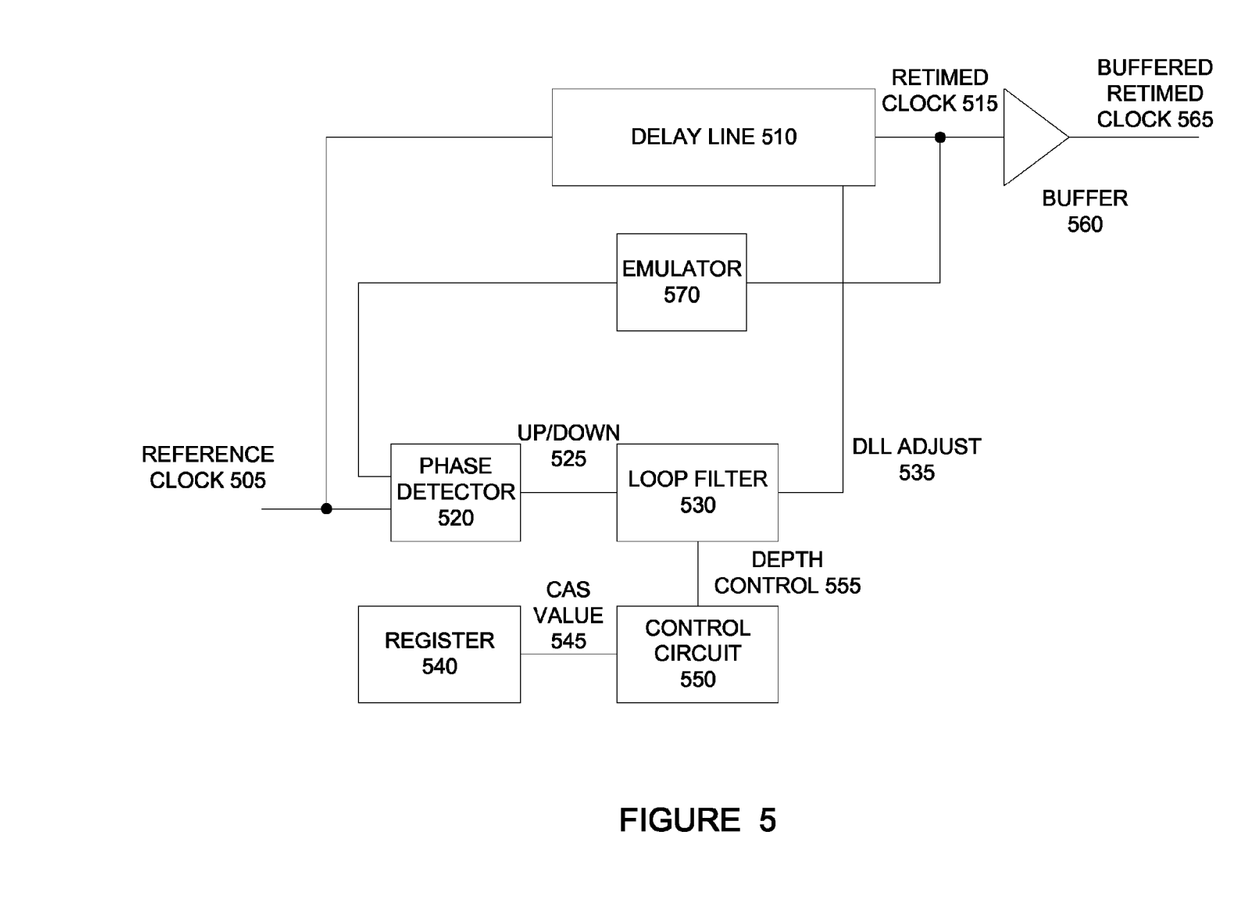
FIG. 5 illustrates a delay-locked loop that includes an emulator circuit according to an embodiment of the present invention.

In various embodiments of the present invention, the retimed clock signal may need to be buffered, provided to a pad, or it may be delayed in other ways. In various embodiments of the present invention, it is desirable to compensate for these delays. Accordingly, an emulator circuit that matches these delays may be used. An example of a delay-locked loop that incorporates an emulator circuit is shown in the following figure.

FIG. 5 illustrates a delay-locked loop that includes an emulator circuit according to an embodiment of the present invention. In this example, buffer 560 is included to buffer the retimed clock signal on line 515 to provide a buffered retimed clock signal on line 565. The retimed clock signal on line 515 is thus delayed by the buffer 560 to generate the buffered retimed clock signal on line 565. An emulator 570 is inserted between the output of delay line 510 and the input of phase detector 520. The emulator 520 emulates the delay through the buffer 560, as well as any other associated delays caused by pads or other circuits.

Figure 6:
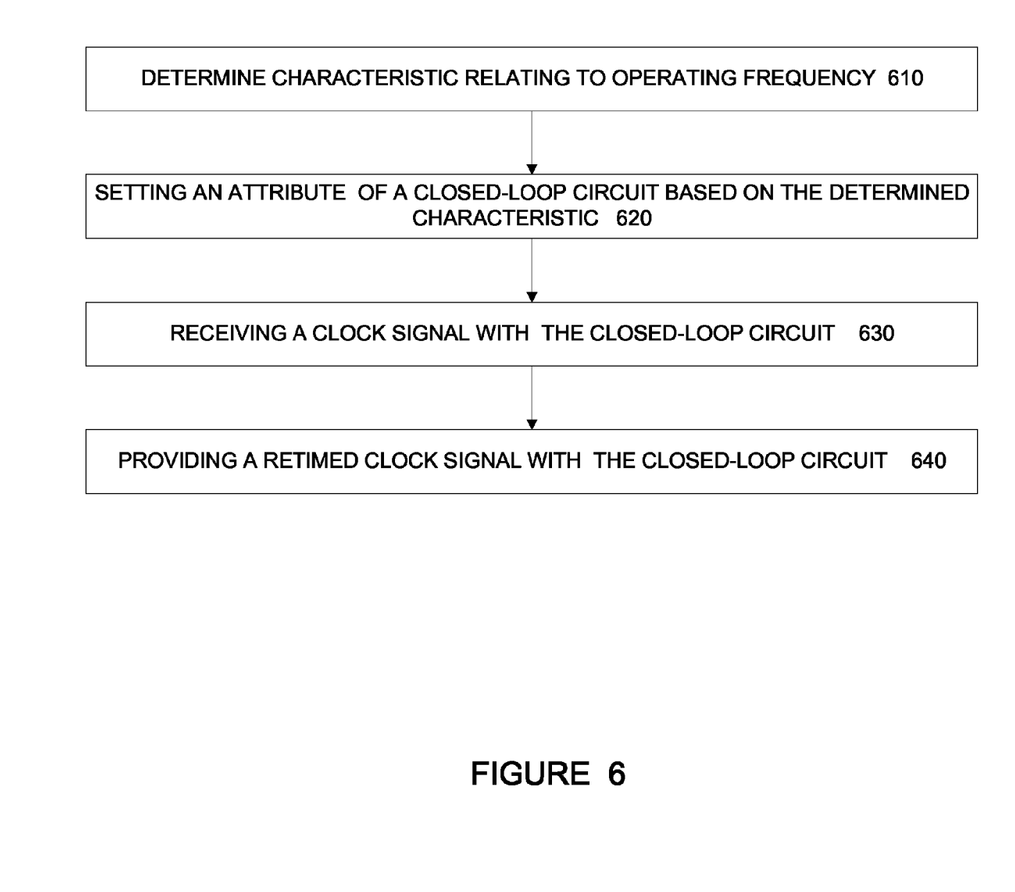
FIG. 6 is a flowchart of a method of retiming a clock signal according to an embodiment of the present invention.

Again, embodiments of the present invention provide closed-loop clock circuits where an attribute or parameter of the closed-loop circuit is set depending on a characteristic relating to an operating frequency of the closed-loop clock circuit. An example is shown in the following figure.

FIG. 6 is a flowchart of a method of retiming a clock signal according to an embodiment of the present invention. In act 610, a characteristic relating to operating frequency is determined. Again, this may be the operating frequency itself, it may be a column address select latency value, or it may be another characteristic. An attribute of a closed-loop clock circuit is set based on the determined characteristic in act 620. Again, the attribute may be a depth or type of filter. In act 630, a clock signal is received by the closed-loop clock circuit. A retimed clock signal is provided by the closed-loop clock circuit in act 640.

Figure 7:
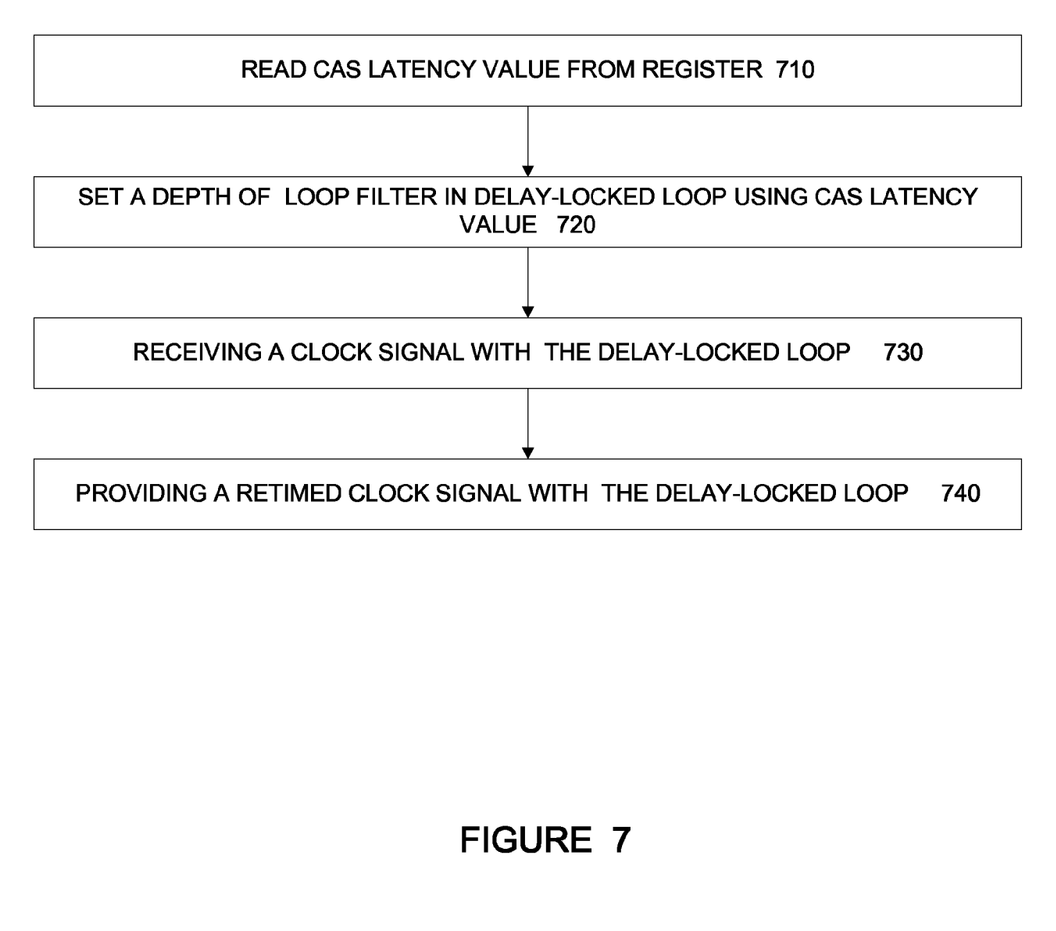
FIG. 7 illustrates a flowchart of a method of retiming a clock signal according to an embodiment of the present invention.

Again, in a specific embodiment of the present invention, column address select latency is used in determining the depth of the loop filter in a delay-locked loop. An example is shown in the following figure.

FIG. 7 illustrates a flowchart of a method of retiming a clock signal according to an embodiment of the present invention. In act 710, a column address select latency value is read from a register. In act 720, a depth of a loop filter in a delay-locked loop is set using the column address select latency value. A clock signal is received with the delay-locked loop in act 730. A retimed clock signal is provided using the delay-locked loop in act 740.

In these examples, the depth, type, or both depth and type, of a loop filter are varied depending on operating frequency. In other embodiments of the present invention, the depth, type, or both depth and type, of a loop filter is varied depending on both phase error and operating frequency. Examples of how the depth and type of the loop filter can be varied due to phase error can be found in copending U.S. patent application Ser. No. 12/818,945 titled DELAY-LOCKED LOOP HAVING LOOP BANDWIDTH DEPENDENCY ON PHASE ERROR, by Kim, which is incorporated by reference.

In an embodiment of the present invention, both the operating frequency and a range for a phase error are determined. Based on these determinations, a depth and type of filter for a loop filter are set. In a specific embodiment of the present invention, the operating frequency is determined by reading a value for column address select latency. In this specific embodiment, it is also determined whether a current phase error is larger than one or more threshold values. Based on the value for column address select latency and the size of the phase error, either or both of the depth and type of filter are adjusted.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A method of providing a clock signal, the method comprising:
   determining a characteristic related to a frequency for the clock signal;
   setting a first attribute of a closed-loop clock circuit based on the determined characteristic;
   receiving the clock signal with the closed-loop clock circuit; and
   providing a retimed clock signal with the closed-loop clock circuit,
   wherein the first attribute of the closed-loop clock circuit comprises a filter depth.

2. The method of claim 1 wherein determining a characteristic related to a frequency for the clock signal comprises reading a value for a column address select latency.

3. The method of claim 1 wherein determining a characteristic related to a frequency for the clock signal comprises measuring a frequency of the clock signal.

4. The method of claim 1 wherein the provided clock signal is provided to a memory core on a memory device.

5. The method of claim 4 wherein determining a characteristic related to a frequency for the clock signal comprises reading a value for a column address select latency.

6. The method of claim 5 wherein the value for a column address select latency is read from a register on the memory device.

7. The method of claim 1 further comprising setting a second attribute based on the determined characteristic, wherein the second attribute comprises a filter type.

8. The method of claim 1 wherein the closed-loop clock circuit is a delay-locked loop.

9. The method of claim 1 wherein the closed-loop clock circuit is a phase-locked loop.

10. A method of providing a clock signal on a memory device, the method comprising:
    reading a value for a column select latency from a register on the memory device;
    setting a filter depth in a delay-locked loop based on the value for the column select latency;
    receiving the clock signal with the delay-locked loop; and
    providing a retimed clock signal with the delay-locked loop.

11. The method of claim 10 wherein the memory device is compliant with DDR3.

12. The method of claim 10 wherein the memory device is compliant with DDR4.

13. An integrated circuit comprising:
    an input/output circuit comprising a delay-locked loop, the delay-locked loop comprising:
       a phase detector having a first input to receive a clock signal;
       a loop filter having an input coupled to an output of the phase detector; and
       a delay line coupled to receive the clock signal, an output to provide a retimed clock signal to a second input of the phase detector, and a control input to receive an output of the loop filter; and
    a control circuit to read a column address select latency value from a register and to use the column address select latency value to set a depth of the loop filter.

14. The integrated circuit of claim 13 wherein the loop filter is a moving-average filter.

15. The integrated circuit of claim 13 wherein the register is located on the integrated circuit.

16. The integrated circuit of claim 15 wherein the first input of the phase detector is coupled to a pad.

17. The integrated circuit of claim 16 wherein the output of the delay line is coupled to a memory core.

18. The integrated circuit of claim 13 wherein the register is located on a second integrated circuit, the second integrated circuit coupled to the integrated circuit.

19. The integrated circuit of claim 18 wherein the output of the delay line is coupled to a pad.

20. The method of claim 10 further comprising:
    setting a filter type in a delay-locked loop based on the value for the column select latency.

21. The integrated circuit of claim 13, wherein the control circuit further uses the column address select latency value to set a type of the loop filter.

* * * * *